United States Patent [19]
Sandhu

[11] Patent Number: 5,602,795
[45] Date of Patent: Feb. 11, 1997

[54] METHOD AND APPARATUS FOR IMPLEMENTING A HIGH-SPEED DYNAMIC LINE DRIVER

[75] Inventor: Bal S. Sandhu, Fremont, Calif.

[73] Assignee: Sun Microsystems, Inc., Mountain View, Calif.

[21] Appl. No.: 180,577

[22] Filed: Jan. 12, 1994

[51] Int. Cl.$^6$ ................................................ G11C 8/00
[52] U.S. Cl. .................... 365/230.06; 365/233.5; 365/49; 365/202
[58] Field of Search ................ 365/230.06, 233, 365/190, 202, 233.5, 49

[56] References Cited

U.S. PATENT DOCUMENTS

| | | | |
|---|---|---|---|
| 5,325,507 | 6/1994 | Freitas et al. | 365/49 X |
| 5,418,756 | 5/1995 | McClure | 365/233.5 |
| 5,455,802 | 10/1995 | McClure | 365/233 |
| 5,471,415 | 11/1995 | McClure | 365/202 X |

*Primary Examiner*—David C. Nelms
*Assistant Examiner*—Huan Hoang
*Attorney, Agent, or Firm*—Blakely Sokoloff Taylor & Zafman LLP

[57] ABSTRACT

A high speed line driver circuit that drives an output line based on an input line is disclosed. The high speed line driver circuit uses dynamic precharging of the output lines to speed the transition of the output lines to the proper output voltage level. The high speed line driver circuit precharges the output lines to an equalized voltage level between Vcc and Vss when in a "stand-by" mode. Using an NMOS transistor, the equalized voltage level is Vcc–Vtn where Vtn is the threshold voltage of the NMOS transistor. An edge detection circuit determines when the output lines must be driven. The edge detection circuit normally remains low until a voltage level change on the input line is detected. When a voltage level change occurs, the equalization is turned off and the line driver circuit drives the output lines to the level dictated by the input line.

17 Claims, 6 Drawing Sheets

METHOD AND APPARATUS FOR IMPLEMENTING A HIGH-SPEED DYNAMIC LINE DRIVER

BACKGROUND OF THE INVENTION

1. Field of the Invention

The present invention relates to the field of line drivers for digital circuits. Specifically, the present invention relates to a high-speed line driver that is optimal for driving compare lines within a content addressable memory unit.

2. Art Background

Content addressable memory is a type of memory that is accessed by requesting whether or not a particular piece of data is stored in the content addressable memory. For example, a circuit may place a data value on a bus coupled to a content addressable memory and ask the content addressable memory if it contains the data value placed on the bus. If the content addressable memory contains the requested data value, the content addressable memory generates a positive response on an output line.

Within a content addressable memory are n entries for storing data values. Each of the entries in the content addressable memory consists of m memory cells wherein m equals the width of the data stored in the content addressable memory. Each memory cell is connected to a compare line that carries input data. Each memory cell connected to a compare line loads the compare line with resistance and capacitance (RC loading). Therefore, to properly drive a compare line in an n entry content addressable memory, a compare line driver must provide sufficient current to drive the RC loading caused by the n memory cells coupled to the compare line.

FIG. 1 shows a typical prior art line driver circuit for driving compare lines in a content addressable memory. The prior art line driver circuit comprises a pair of NAND gates (81 and 82) for prebuffering and two pairs of conventional CMOS inverter circuits (91 and 93, 95 and 97) for driving the load on the CL and $\overline{CL}$ compare lines.

To construct a compare line driver using the prior art line driver circuit as illustrated in FIG. 1, the individual transistors (not shown) of the line driver circuit must be constructed large enough to provide sufficient current to drive the RC loading on the compare lines within the content addressable memory. Thus, to drive compare lines in a large content addressable memory array, prior art compare line drivers require a large amount of die layout area.

Furthermore, the output line of the prior art compare line driver circuit is static, meaning that in the compare line driver circuit's reset state, one compare line is high and the other compare line is low. In the next set phase of the circuit, the CL and $\overline{CL}$ compare lines may need to change logical states, and therefore go through a full voltage level swing. Since a full voltage level swing requires a complete voltage swing rise time and a complete voltage swing fall time, the typical prior art compare line driver is also slow.

Therefore, it would be desirable to construct a compare line driver that does not require large amount of die layout area. Furthermore, it would be desirable to construct a compare line driver that quickly drives the compare lines in a content addressable memory to the proper logic level such that the content addressable memory can provide a very fast response to the memory inquiry.

SUMMARY OF THE INVENTION

The present invention provides a method and apparatus for implementing an improved line driver circuit. The line driver circuit of the present invention is ideal for driving lines within a content-addressable memory array.

The line driver circuit of the present invention comprises a first driver circuit, a second driver circuit, and an equalization circuit. The first driver circuit drives a first output signal responsive to the input signal. The second driver circuit drives a second output signal responsive to a compliment of the input signal. The equalization circuit is coupled to the output of the first driver circuit and the second driver circuit. The equalization circuit holds the first output signal and the second output signal at a first predetermined potential during a reset phase of said driver circuit.

The line driver circuit of the present invention monitors the input signal to detect changes in the input signal. When in a "stand-by" mode, the line driver circuit precharges the output lines to an equalized voltage level between Vcc and Vss. The edge detection circuit determines when the compare lines must be driven. When the edge detection circuit detects a change in the input signal, the equalization is turned off and the line driver circuit quickly drives the output lines to the proper levels. The dynamic precharging of the compare lines reduces the rise and fall time of the output lines.

DETAILED DESCRIPTION OF THE INVENTION

A method and apparatus for a high speed line driver that drives compare lines within a content addressable memory is disclosed. In the following description, for purposes of explanation, specific configurations of the system are set forth in a preferred embodiment in order to provide a thorough understanding of the present invention. However, it will be apparent to one skilled in the art that the present invention may be practiced without the specific details of the preferred embodiment. In other instances, well known circuits and devices are shown in block diagram form in order not to obscure the present invention unnecessarily.

An Improved Compare Line Driver

Figure 1:
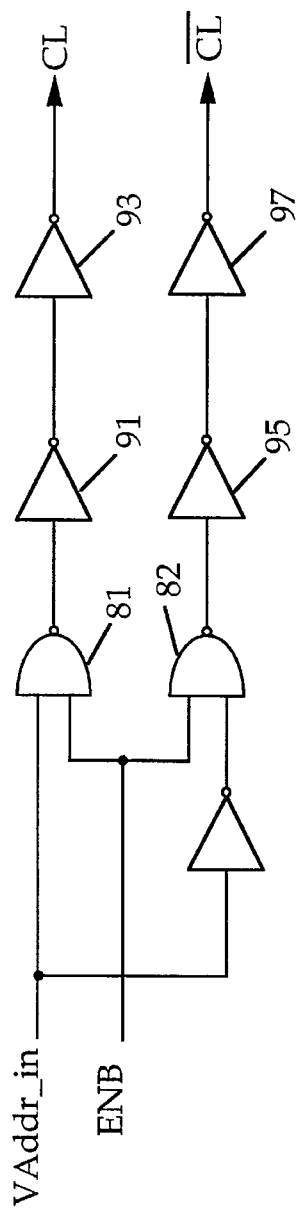
FIG. 1 illustrates a typical prior art compare line driver for a translation look-aside buffer.
Figure 2:
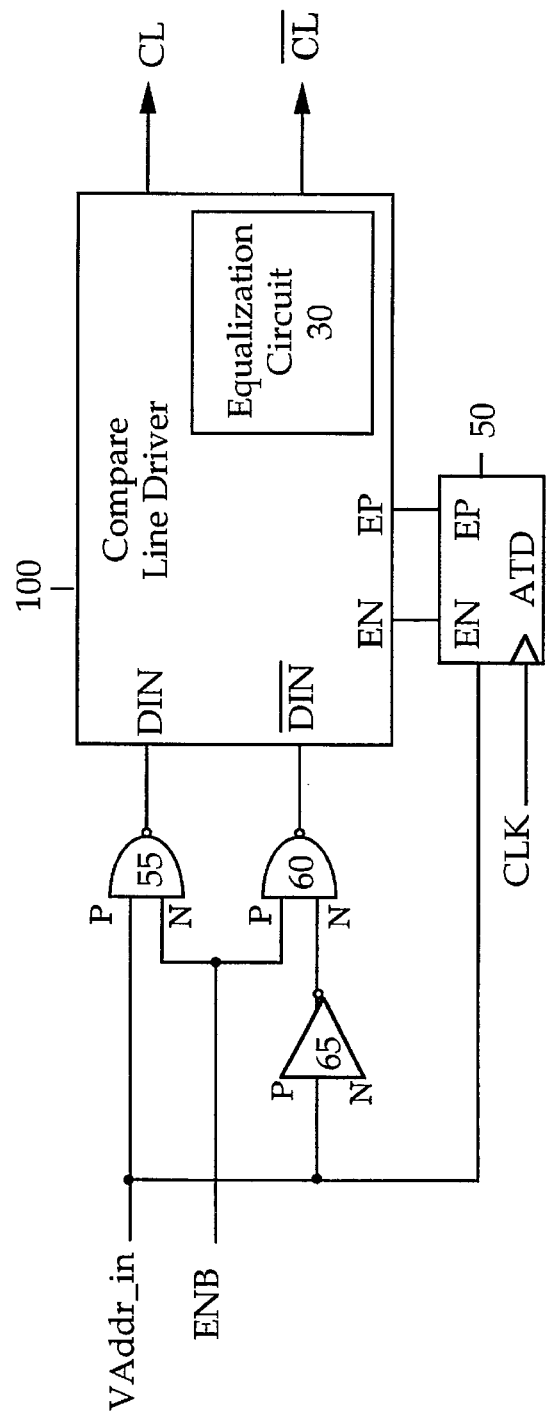
FIG. 2 is a block diagram of the line driver circuit of the present invention.

FIG. 2 illustrates a block diagram of the improved line driver circuit of the present invention. The improved line driver circuit of the present invention includes a compare line driver circuit 100, an edge detection circuit 50, two NAND gate drivers 55 and 60, and an inverter 65. The inverter 65 inverts the incoming VAddr_in data signal to create a complement (VAddr_in) data signal. The two NAND gate drivers 55 and 60 drive the VAddr_in and VAddr_in signals into the compare line driver circuit 100 of the present invention. The edge detection circuit 50 detects changes in the incoming VAddr_in data signal and passes this information to the compare line driver circuit 100.

During operation, an incoming data bit on an the VAddr_in line is routed to two NAND gate drivers 55 and 60. Furthermore, the incoming data bit is also routed to the input of an edge detection circuit block 50. When the line driver circuit is in a reset state, the edge detection circuit 50 outputs a logic low signal on the EN output line and a logic high on the EP output line. An equalization circuit 30 within the compare line driver circuit 100 maintains the CL and CL output lines at an intermediate voltage between the full voltage swing of CL and CL output lines.

However, when the data bit on the VAddr_in line changes, the edge detection circuit 50 generates a pulse that drives the EN output high and the EP output low for a brief period. The logic high EN signal and logic low EP signal enable the line driver circuit 100 such that the compare line driver circuit 100 drives the CL and CL output lines to the correct levels as dictated by the incoming VAddr_in and VAddr_in data signals. The width of the pulse on the EN and the EP lines is based on the time required to keep the compare line driver circuit 100 enabled so that the content addressable memory array can be accessed.

The Edge Detection Circuit

Figure 3:
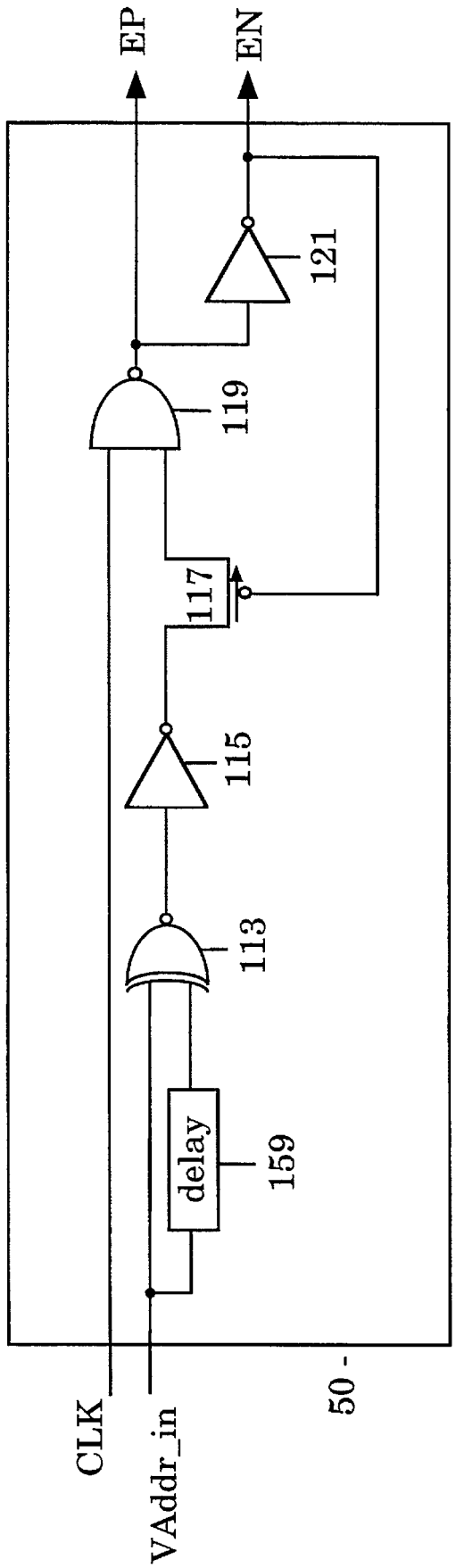
FIG. 3 is a block diagram of an edge detection circuit used in the line driver circuit of the present invention.

FIG. 3 illustrates a block diagram of the internal circuitry that comprises the edge detection circuit 50. The edge detection circuit 50 comprises a delay circuit 159, an exclusive NOR (XNOR) gate 113, an inverter 115, a PMOS transistor 117, a NAND gate 119, and an inverter 121. The edge detection circuit 50 generates two outputs EP and EN (the logical compliment of EP).

Referring to FIG. 3, the delay circuit 159 receives data on the VAddr_in line and generates a delayed copy of the data (VAddr_in_delayed). The exclusive NOR gate 113 generates a high output when the data bit on the VAddr_in line and a delayed data bit (VAddr_in_delayed) are equal (i.e. both high or both low). In a steady state, the VAddr_in line and the VAddr_in_delayed are equal such that the exclusive NOR gate 113 outputs a high value. However, when the data bit on the VAddr_in line changes from high to low or from low to high, the delayed data bit signal (VAddr_in_delayed) will not equal the normal data bit signal, and therefore, the output of the exclusive NOR gate 113 will go low. Thus, when the incoming data bit on the VAddr_in line changes, the output of the exclusive NOR gate 113 will go low.

The output of the exclusive NOR gate 113 passes through the inverter 115 and the PMOS transistor 117. The inverter 115 inverts the signal such that a high signal is generated when a change occurs. The PMOS transistor 117 is shut off whenever the EN output signal is in a high state.

The output of PMOS transistor 117 is combined with system clock signal CLK at NAND gate 119 such that the output of PMOS transistor 117 is only sampled for changes when the system clock signal CLK is high. When the system clock signal CLK is low, any change of the output of PMOS transistor 117 is disregarded. Thus when the system clock signal CLK is low, any change of the VAddr_in line is disregarded.

In a reset state of the edge detection circuit 50, the EN output is low and the EP output is high. The edge detection circuit 50 is reset each time the system clock signal CLK goes low since the system clock signal CLK input to the NAND gate 119 causes the NAND gate 119 to output a high value on EP and a low value on EN. Since EN is low in the reset state, the PMOS transistor 117 will be open thereby allowing the edge detection by the exclusive NOR gate 113 to pass.

When the incoming data bit on the VAddr_in line changes and forces the exclusive NOR gate 113 low, the output of the inverter 115 will go high. If this occurs while the system clock signal CLK is high, both inputs to the NAND gate 119 (the system clock signal CLK and the output of inverter 115) will be high, thereby forcing the output of EP low and the output of EN high. Thus the edge detection circuit 50 is put into a set state when an edge is detected and the system clock signal CLK is high. When the edge detection circuit 50 is in a set state, the gate of the PMOS transistor 117 is turned off to prevent any change in the output of inverter 115 propagating to NAND gate 119. The edge detection circuit 50 will return to the reset state when the system clock signal CLK goes low. Hence, the edge detection circuit 50 will remain in a set state thereby signaling a detected edge while the system clock signal CLK remains high.

Eventually, the delayed data bit (VAddr_in_delayed) will catch up with the data bit on the VAddr_in line and reset the exclusive NOR gate 113 to high and, consequently, the output of the inverter 115 will go low. However, this change is not propagated to the NAND gate 119 since PMOS transistor 117 is shut off. At the end of the high phase of the system clock signal CLK, the system clock signal CLK goes low thereby driving the output of the NAND gate 119 high. The high output of NAND gate 119 resets the edge detection circuit 50, forcing the output of EN back low and thus re-opens PMOS transistor 117 for further data bit transitions on the VAddr_in line when the system clock signal CLK goes back high.

The delay circuit 159 in the edge detection circuit 50 comprises a series of inverters. This delay circuit is set, such that the delay of the exclusive NOR gate 113 going low and forcing EN high to cut off the gate of 117 is always faster than the delay from the VAddr_in input to the VAddr_in_delayed output.

In summary, the edge detection circuit 50 remains in a reset set whenever the system clock signal CLK is low. In the reset state, the EN output is low and the EP output is high. If a change occurs on VAddr_in input line while the system clock signal CLK is high, the edge detection circuit 50 enters a set state. In the set state, the EN output is high and the EP output is low. Once the edge detection circuit 50 enters the set state, the edge detection circuit 50 will remain in the set state until the system clock signal CLK goes low.

The Line Driver Circuit

Figure 4:
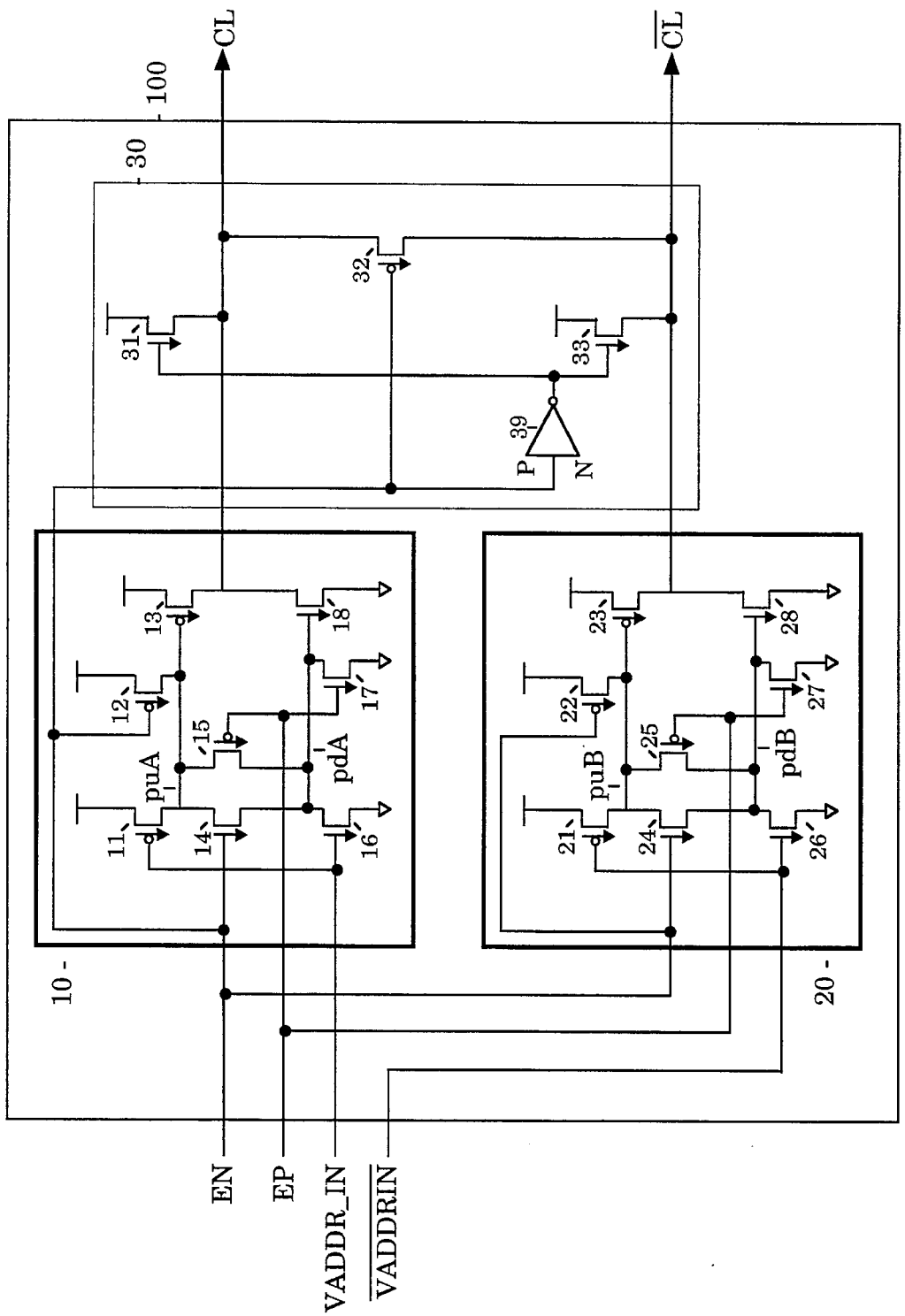
FIG. 4 illustrates the CMOS gate structure of the line driver circuit in the present invention.

FIG. 4 illustrates the internal circuitry of the compare line driver circuit 100 of the present invention. The compare line driver circuit 100 contains two high-gain non-inverting driver stages (10 and 20) and an equalization stage 30.

The first non-inverting driver stage 10 receives the data bit on the VAddr_in line and the EN and EP equalization signals from the edge detection circuit 50. The second non-inverting driver stage 20 receives an inverted data bit on the VAddr_in line and the equalization signals EN and EP from the edge detection circuit 50. The first non-inverting driver stage 10 drives the CL compare line output and the second non-inverting driver stage 20 drives the $\overline{\text{CL}}$ compare line output.

The equalization stage 30 receives the EN signal and drives both the CL and $\overline{\text{CL}}$ compare lines to equal voltage levels during precharging when the two non-inverting driver stages 10 and 20 are not driving the CL and $\overline{\text{CL}}$ compare line outputs.

When the edge detection circuit 50 is in its reset state, the EN signal is low and the EP signal is high. Referring to non-inverting driver stage 10, when EN is low and EP is high, transistors 14 and 15 are off and transistors 12 and 17 are on. This causes line puA to be high and line pdA to be low, thereby turning off pull-up transistor 13 and pull down transistor 18. Since transistors 13 and 18 are both off, the CL output line will be in a high impedance state (or tri-stated). Thus, when EN is low and EP is high, the non-inverting driver stage 10 puts the CL output line in a high impedance state. Similarly, the identical non-inverting driver stage 20 also places its $\overline{\text{CL}}$ output line into a high impedance state when the edge detection circuit (not shown) is in its reset state.

Furthermore, when the edge detection circuit 50 is in its reset state, the low EN signal enables the equalization stage 30. When the equalization stage 30 is enabled, the low EN signal activates transistors 31, 32, and 33. The activated transistors 31 and 33 drive the output lines CL and $\overline{\text{CL}}$ to a voltage level of Vcc–Vtn, where Vtn is the threshold voltage of an NMOS transistor (Vtn≡1 V). Thus, when Vcc=5 V, the CL and $\overline{\text{CL}}$ output lines are driven to 5 V–1 V=4 V. Furthermore, activated equalization transistor 32 ensures that the CL and $\overline{\text{CL}}$ output lines are driven to the same voltage level.

When the data bit on the VAddr_ in line changes, the edge detection circuit enters its set state. In its set state, the edge detection circuit drives the EN line high and the EP line low for a period of time. The high EN signal and the low EP signal disable the equalization block 30, thus allowing CL and $\overline{\text{CL}}$ output lines to pass from the first and second driver stages 10 and 20 through the equalization block 30 unaltered.

Furthermore, when the edge detection circuit 50 enters a set state, the high EN signal and the low EP signal activate the first and second driver stages 10 and 20. Referring to non-inverting driver stage 10, when EN is high and EP is low transistors 14 and 15 are on and transistors 12 and 17 are off. This causes and line puA to equal line pdA wherein both lines are set to the compliment of the value on VAddr_ in. Transistors 13 and 18 drive the CL output line to the compliment of the value on the puA and pdA lines. Thus, when EN is high and EP is low, the non-inverting driver stage 10 drives the CL output line to the same value on the VAddr_ in line. Similarly, the identical non-inverting driver stage 20 also drives its output $\overline{\text{CL}}$ to the value on the $\overline{\text{VAddr\_in}}$ line.

The Line Driver Circuit In A Translation Look-Aside Buffer

The line driver circuit of the present invention is ideal for driving content addressable memory arrays. One common use of content addressable memory is in a translation look-aside buffer.

Many modern computers use virtual memory to simulate a very large addressable memory area. Virtual memory addresses are mapped into physical addresses in main memory. To perform high speed virtual address to physical address translations, many computers use a dedicated high speed cache that stores a set of address translations mappings. The cache that stores the address translations is referred to as the "translation look-aside buffer" (TLB).

Figure 5:
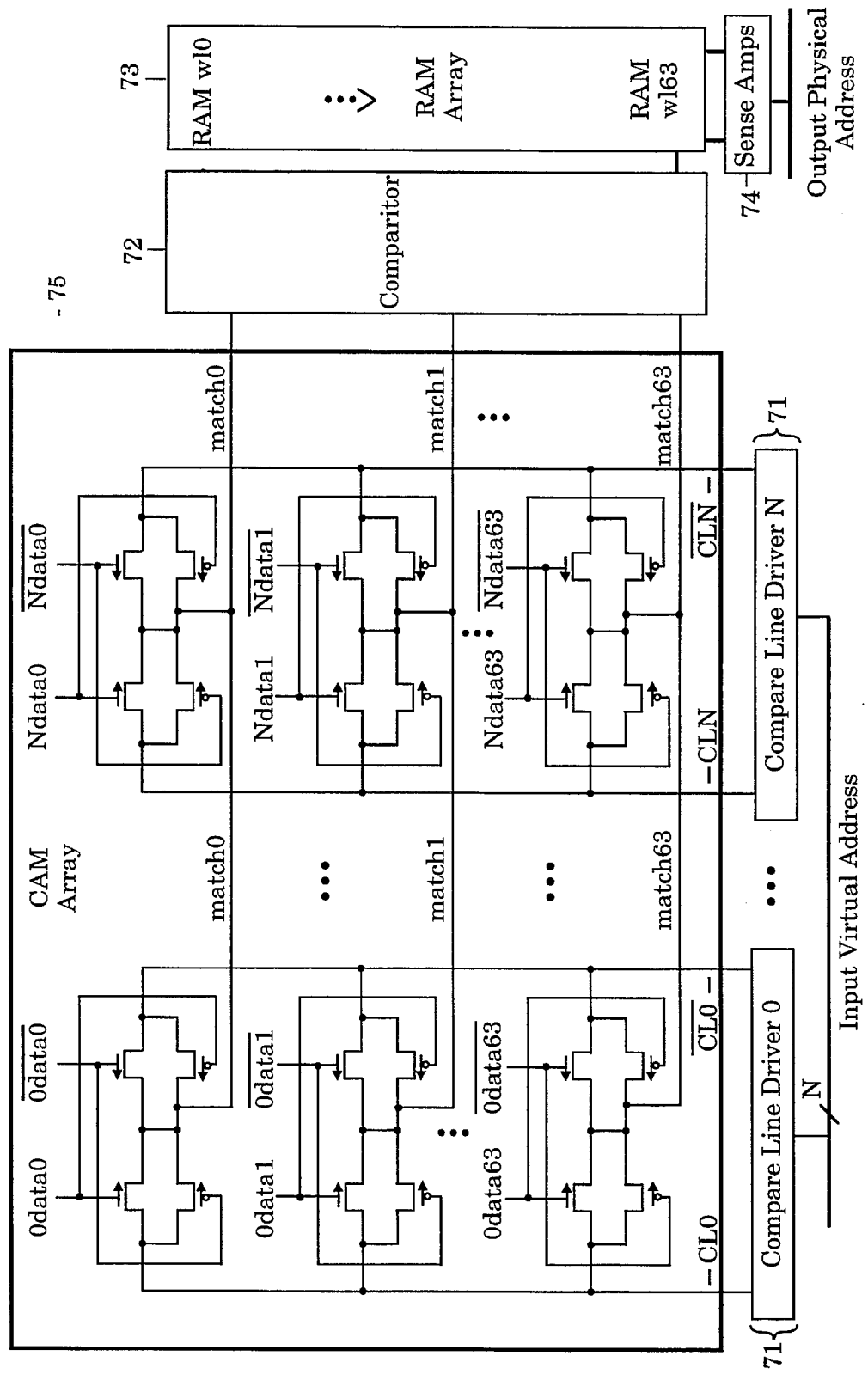
FIG. 5 is a block diagram of a typical 64 entry translation look-aside buffer.

FIG. 5 illustrates a block diagram of a typical 64 entry translation look-aside buffer. The translation look-aside buffer is comprised of two memory arrays: a content addressable memory array and a random access memory array. The content addressable memory 75 contains a set of memory cells that store the virtual addresses for which there are physical address translations available. The random access memory (RAM) array 73 stores a translated physical address for each virtual address in the content addressable memory array 75.

At the bottom of FIG. 5, an N-bit virtual address to be translated is buffered by a set of compare line drivers 71 as disclosed in the previous section. Each compare line driver 71 drives a pair of compare lines into the content addressable memory array 75 of the translation look-aside buffer. The two compare lines carry an incoming virtual address bit (CLn) and the complement of that incoming virtual address bit ($\overline{\text{CLn}}$). Each compare line drives a memory cell for each entry in the content addressable memory array 75. Thus, in the 64 entry translation look-aside buffer of FIG. 5, each compare line drives 64 memory cells. Each memory cell within the CAM array 75 compares the incoming virtual address bit on the compare line with a virtual address bit stored in the memory cell.

When all the virtual address bits in the memory cells for a particular content addressable memory entry equal the associated incoming virtual address bits on the compare lines, a translation look-aside buffer "hit" occurs. A translation look-aside buffer hit causes the comparator 72 to drive one of 64 RAM wordlines into an active state. The active RAM wordline selects the physical address stored in the RAM array 73 that corresponds to the incoming virtual address. The RAM array 73 outputs the selected physical address to the sense amplifiers 74. The buffered translated physical address is then available at the sense amplifier 74 outputs.

Driver circuit behavior in a Translation Look-Aside Buffer

Figure 6A:
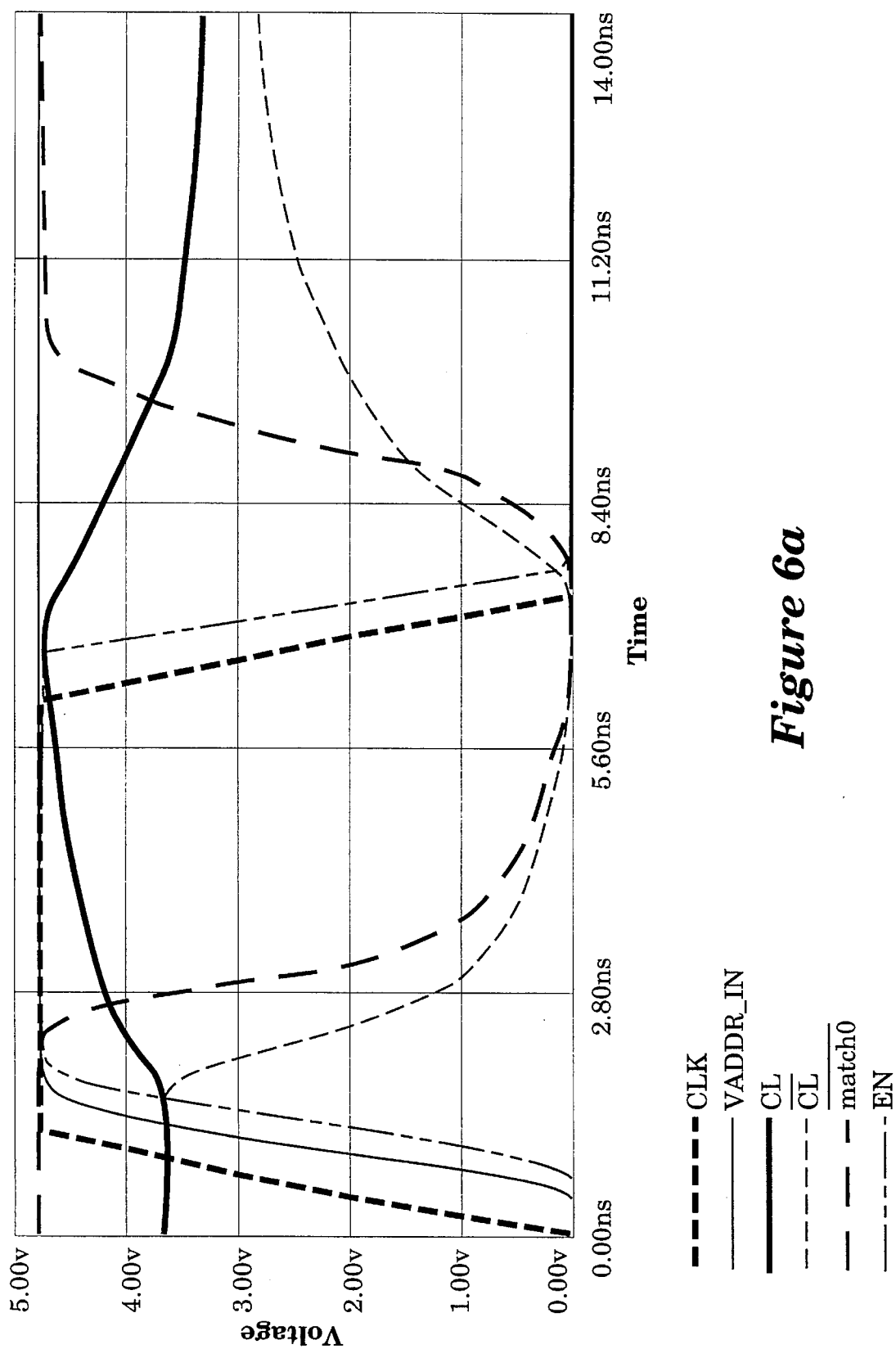
FIG. 6a is a timing diagram that illustrates the behavior of the compare line driver of the present invention when a virtual address input matches an entry in the content addressable memory of the translation look-aside buffer.
Figure 6B:
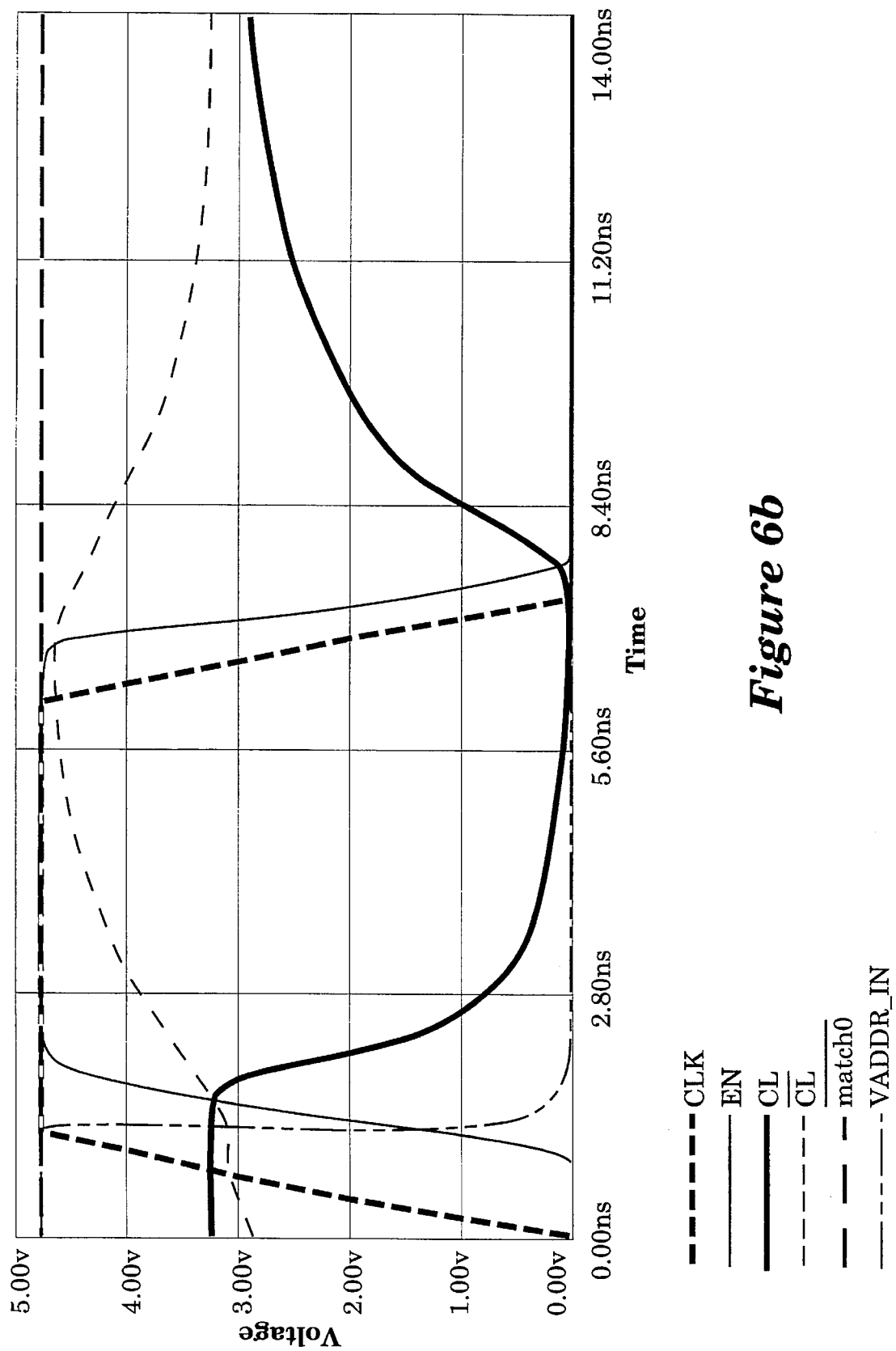
FIG. 6b is a timing diagram that illustrates the behavior of the compare line driver of the present invention when a virtual address input does not match any entry in the content addressable memory of the translation look-aside buffer.

FIGS. 6a and 6b illustrate the behavior of the line driver circuit of the present invention when used in the translation look-aside buffer as depicted in FIG. 5. FIG. 6a illustrates the behavior of the line driver circuit of the present invention when a TLB "hit" occurs since the incoming virtual address matches an entry in a content addressable memory array of the translation look-aside buffer. FIG. 6b illustrates the behavior of the compare line driver when a TLB "miss" occurs since the incoming virtual address does not match any entry in the translation look-aside buffer.

Referring to FIG. 6a, the two compare lines (CL and $\overline{\text{CL}}$) are initially equalized at a voltage level between Vcc and Vss (substrate voltage). In the present embodiment, the two compare lines (CL and $\overline{\text{CL}}$) are equalized at a voltage level of Vcc–Vtn (approximately 4 V) by the equalization stage 30 when the edge detection circuit is reset. Since the CL compare line starts at Vcc–Vtn (4 V), if the incoming virtual address bit is set, then the CL compare line only needs to swing 1 V from Vtn to Vcc (i.e. from 4 V to 5 V). The $\overline{\text{CL}}$ compare line correspondingly swings from Vcc–

Vtn (4 V) to Vss. The active low match line (match0), therefore, will also quickly go low such that the CAM array output can be latched. The equalization pulse signals (EN and EP) eventually return to normal steady state (0 and 1 for EN and EP, respectively), and the match line (match0) and compare lines (CL and CL) return to their initial states.

FIG. 6b illustrates the behavior of the compare line driver when the virtual address does not match an entry in the translation look-aside buffer. Once again, the compare lines CL and CL are equalized at a voltage level of Vcc–Vtn (approximately 4 V) such that the CL compare line does not have to swing very far to indicate that a "miss" has occurred. When a "miss" occurs, the match line (match0) remains high. After the equalization pulse signals (EN and EP) goes low, the compare lines (CL and CL) are again equalized and wait for the next cycle.

The compare line driver of the present invention offers three main advantages over the prior art compare line driver. The compare line driver of the present invention offers high speed since it uses dynamic circuits for address detection and equalization. Second, the compare line driver of the present invention uses less AC switching current than prior art compare line drivers since the driver of the present invention does not have to swing full rail. Finally, since precharging is used, the compare line driver of the present invention can be sized much smaller, saving die layout area.

Accordingly, apparatus and methods for implementing a high speed line driver have been disclosed. Although the present invention has been described with reference to the FIGS. 1 through 6b, it will be apparent to one skilled in the art that the present invention has utility far exceeding that disclosed in the figures. It is contemplated that many changes and modifications may be made, by one of ordinary skill in the art, without departing from the spirit and scope of the invention as disclosed herein.

What is claimed is:

1. An apparatus, said apparatus comprising:

a first driver circuit, said first driver circuit for driving a first output signal between a first potential and a second potential in response to an input signal;

an edge detection circuit coupled to said input signal, said edge detection circuit determining if said first driver circuit is in a reset state or a set state, said edge detection circuit temporarily entering said set state when detecting a voltage level change on said input signal;

an equalization circuit coupled to said first driver circuit, said equalization circuit for holding said first output signal at an intermediate potential between said first potential and said second potential during said reset state of said first driver circuit.

2. The apparatus as claimed in claim 1 wherein said first output signal enters a high impedance state when said first driver circuit is in said reset state.

3. The apparatus as claimed in claim 1 wherein said apparatus further comprises a second driver circuit, said second driver circuit for driving a second output signal between second first potential and second potential in response to a complement input signal, said second driver circuit coupled to said equalization circuit wherein said equalization circuit is also for holding said second output signal at said intermediate potential between said first potential and said second potential during a reset state of said second driver circuit.

4. The apparatus as claimed in claim 3 wherein said equalization circuit sets said first output signal and said second output signal to an equalized voltage level between Vcc and Vss.

5. The apparatus as claimed in claim 4 wherein said equalized voltage level is Vcc–Vtn where Vtn is a threshold voltage of an NMOS transistor.

6. The apparatus as claimed in claim 5 wherein said first output signal is a compare line in a content addressable memory.

7. The apparatus as claimed in claim 6 wherein said content addressable memory is in a translation look-aside buffer.

8. A method driving an output signal in response to an input signal, said method comprising the steps of:

monitoring said input signal to generate an enable signal, said enable signal normally inactive, said enable signal temporarily active when a voltage level change is detected on said input signal;

setting said output signal to an equalized voltage level when said enable signal is inactive; and driving said output signal responsive to said input signal when said enable signal is active.

9. The method driving an output signal in response to an input signal as claimed in claim 8 wherein said step of setting said output signal to an equalized voltage level comprises setting said output signal to an equalized voltage level between Vcc and Vss when said enable signal is inactive.

10. The method driving an output signal in response to an input signal as claimed in claim 9 wherein said equalized voltage level is Vcc–Vtn where Vtn is a threshold voltage of an NMOS transistor.

11. The method driving an output signal in response to an input signal as claimed in claim 10 wherein said output signal is a compare line in a content addressable memory.

12. The method driving an output signal in response to an input signal as claimed in claim 11 wherein said content addressable memory is in a translation look-aside buffer.

13. A computer system comprising a translation look-aside buffer, said translation look-aside buffer comprising the elements of:

a plurality of content addressable memory entries, each content addressable memory entry comprising n memory cells, each memory cell comprising a data bit;

n compare line driver circuits, each of said n compare line driver circuits associated with said n memory cells in each of said content addressable memory entries, each of said n compare line driver circuits driving a pair of compare lines coupled to said n memory cells, each of said compare line driver circuits comprising a first driver circuit, said first driver circuit driving a first compare line responsive to said an input signal;

a second driver circuit, said second driver circuit driving a second compare line responsive to a complement of said input signal; and an equalization circuit coupled to said first driver circuit and said second driver circuit, said equalization circuit holding said first compare line and said second compare line at a first predetermined potential during a reset state of said first driver circuit.

14. The translation look-aside buffer claimed in claim 13 wherein each of said compare line driver circuits further comprises has a reset state and set state, each of said compare line driver circuits entering said set state when a voltage level change on said input signal occurs.

15. The translation look-aside buffer claimed in claim 14 wherein said first driver circuit and said second driver circuit enter a high impedance state when said enable circuit is in a reset state.

16. The translation look-aside buffer claimed in claim 14 wherein each of said compare line driver circuits further comprises an edge detection circuit, said edge detection detecting when a voltage level change on said input signal occurs.

17. The translation look-aside buffer claimed in claim 16 wherein said equalization circuit sets said first compare line and said second compare line to an equalized voltage level between Vcc and Vss.

* * * * *